United States Patent
Wilhelmsson et al.

(10) Patent No.: US 8,731,500 B2
(45) Date of Patent: May 20, 2014

(54) AUTOMATIC GAIN CONTROL BASED ON BANDWIDTH AND DELAY SPREAD

(75) Inventors: Leif Wilhelmsson, Dalby (SE); Jan Celander, Malmö (SE); Lars Sundström, Lund (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 943 days.

(21) Appl. No.: 12/361,578

(22) Filed: Jan. 29, 2009

(65) Prior Publication Data
US 2010/0189203 A1    Jul. 29, 2010

(51) Int. Cl.
*H04B 17/02*    (2006.01)

(52) U.S. Cl.
USPC ..... 455/136; 455/138; 455/232.1; 455/234.1; 455/239.1; 455/240.1; 455/250.1; 455/257; 375/345

(58) Field of Classification Search
USPC ........... 455/234.1, 130, 138, 136, 140, 151.1, 455/154.1, 232.1, 240.1, 241.1, 242.1, 455/242.2, 243.1, 245.1, 245.2, 247.1, 455/250.1, 504, 506; 375/345
See application file for complete search history.

(56) References Cited

U.S. PATENT DOCUMENTS

| | | | |
|---|---|---|---|
| 6,504,863 B1 | 1/2003 | Hellmark | |
| 6,670,901 B2 | 12/2003 | Brueske et al. | |
| 6,693,953 B2 | 2/2004 | Cox et al. | |
| 6,760,362 B2* | 7/2004 | Patel et al. | 375/147 |
| 6,864,817 B1 | 3/2005 | Salvi et al. | |
| 6,993,291 B2 | 1/2006 | Parssinen et al. | |
| 7,046,749 B2* | 5/2006 | Takatz et al. | 375/345 |
| 7,130,364 B2 | 10/2006 | Sintonen | |
| 7,209,528 B2 | 4/2007 | Prater | |
| 7,262,724 B2 | 8/2007 | Hughes et al. | |
| 7,295,812 B2 | 11/2007 | Haapoja et al. | |
| 7,295,813 B2 | 11/2007 | Haub et al. | |
| 2006/0291428 A1* | 12/2006 | Filipovic | 370/335 |
| 2007/0110193 A1* | 5/2007 | Solum | 375/345 |
| 2007/0291880 A1* | 12/2007 | Ashkenazi | 375/345 |
| 2008/0218392 A1 | 9/2008 | Van Veldhoven | |
| 2009/0097579 A1* | 4/2009 | Yeon et al. | 375/260 |
| 2009/0180578 A1* | 7/2009 | Chang et al. | 375/345 |

FOREIGN PATENT DOCUMENTS

| | | |
|---|---|---|
| EP | 1363403 | 11/2003 |
| EP | 1798925 | 6/2007 |
| JP | 2005-244323 A | 9/2005 |
| JP | 2006-173660 A | 6/2006 |
| WO | 98/59417 | 12/1998 |
| WO | 2004/068734 A1 | 8/2004 |
| WO | 2008/015648 A2 | 2/2008 |
| WO | 2008107421 | 9/2008 |
| WO | 2008117130 | 10/2008 |

* cited by examiner

*Primary Examiner* — Yuwen Pan
*Assistant Examiner* — Fatuma Sherif
(74) *Attorney, Agent, or Firm* — Coats and Bennett, P.L.L.C.

(57) ABSTRACT

A gain control circuit adjusts the signal level of a received signal responsive to the bandwidth a received signal and/or the delay spread of the channel in which the signal has propagated. The bandwidth and delay spread are evaluated to estimate the amount of signal variation that is expected due to fast fading. Adjustments to the signal level are then made to avoid clipping while at the same time ensuring that the dynamic range of a receiver component is efficiently utilized.

20 Claims, 7 Drawing Sheets

AUTOMATIC GAIN CONTROL BASED ON BANDWIDTH AND DELAY SPREAD

BACKGROUND

The present invention relates generally to gain control for a receiver in a wireless communication system and, more particularly, to gain control circuit that varies a signal level in a receiver to prevent clipping or saturation effects.

Gain controllers, like automatic gain controllers (AGC) are widely used in wireless communication receivers as a means for reducing the dynamic range requirements of receiver components, such as amplifiers, filters, mixers, analog-to-digital converters, and digital baseband processors. More particularly, the AGC controls the gain of one or more variable-gain-amplifiers (VGA) such that the signal strength in subsequent stages of the receiver are not forced into saturation or clipping levels while at the same time maintaining a maximum signal-to-noise ratio (SNR) for the signal of interest. The AGC may, for instance, try to keep the average signal level a certain amount below the clipping levels (e.g., 10 dB) to provide headroom for transient signal excursions. The amount of headroom needed depends, among other things, on how much and how fast the signal varies around the average signal level. As long as the variations are slow enough for the AGC to follow, they do not create a problem, and therefore the headroom is only needed for the variations that are faster than what can be handled by the AGC. In wireless communications, it can be expected that the AGC will be able to accurately track the slow variations that are due to propagation loss and shadowing effects, whereas the fast fading must be handled by adding headroom. In addition, the transmitted itself typically has a varying envelope, which also must be taken into account.

In virtually every receiver in today's communication system, the signal is converted from the analog domain to the digital domain by means of an analog-to-digital converter (ADC). Converting the signal to the digital domain implies that some quantization error is introduced. To avoid degradation in performance, this quantization error needs to be kept small, which implies that the effective number of bits (ENOB) in the ADC needs to be large.

The ENOB essentially depends on two factors: the number of bits in the ADC and how well the bits in the ADC are used. In order for the ADC work properly, the signal level should be such that the full range of the ADC is utilized, but without causing an overflow. If the signal level if too high, the overflow will distort (clip) the signal. On the other hand, if the signal level is too low, not all the bits in the ADC will be used, which means that the ENOB will be less than the number of bits in the ADC. In this case, the quantization error will be larger than necessary. Since clipping has a severe impact on the signal, one or more of the most significant bits are often used to provide headroom for the signal in order to have some margin from the average power or magnitude level to the clipping level in case the received signal suddenly becomes stronger.

Analog components within a receiver have clipping or saturation levels (and possibly an intermediate region contributing with significant nonlinear distortion) that limits its signal strength operation upwards. Downwards, analog circuits are limited by noise generated by the devices within the circuits. Similar to the ADC's ENOB, analog circuits are typically rated by the dynamic range (DR) or spurious-free dynamic range (SFDR) usually defined as the maximum obtainable SNR and SFDR, respectively.

SUMMARY

The present invention relates to gain control for a receiver in a wireless communication system. The delay spread of a wireless channel and bandwidth of a received signal are used to derive an estimate of the expected signal variation due to fast fading. Typically, the amount of signal variation due to fast fading will decrease as the bandwidth and/or delay spread increase. When the expected signal variation decreases, the gain control circuit adjusts the signal level of the received signal upward to reduce the headroom so that the dynamic range of receiver components is used efficiently. Conversely, when the expected signal variation increases, the gain control circuit adjusts the signal level downward to increase headroom so that clipping is avoided. Adjustments to the signal level are thus made to avoid clipping while at the same time ensuring that the dynamic range of receiver components are efficiently utilized.

Exemplary embodiments of the invention comprise circuits for adjusting the signal level in a received signal. One exemplary circuit may include a bandwidth determination circuit for determining bandwidth of a received signal; a delay spread estimator for estimating the delay spread of a wireless channel; and a gain control circuit configured to adjust the signal level of the received signal to vary the headroom for a signal of a receiver component, such as an analog-to-digital converter, based on the bandwidth of the received signal and/or the delay spread of the wireless channel. The circuit may be implemented in a wireless communication receiver which may be used in a user equipment or a base station operating in a wireless communication system.

Some exemplary embodiments of the invention comprise methods for adjusting the signal level of a received signal in a wireless communication receiver. One exemplary method may comprise receiving a signal propagated through a wireless channel, determining the bandwidth of the received signal and/or determining the delay spread of the wireless channel, and adjusting, by a gain control circuit, a signal level of the received signal based on the bandwidth of the received signal and/or the delay spread of the wireless channel.

In some exemplary methods, the signal level of the received signal may be adjusted by decreasing the signal level to increase headroom for a signal in an analog to digital converter, or other receiver component, responsive to decreasing signal bandwidth and/or decreasing channel delay spread. Conversely, the signal level of the received signal may be adjusted by increasing the signal level to decrease the headroom for the signal of the receiver component, such as the analog to digital converter, responsive to increasing signal bandwidth and/or increasing channel delay spread.

Some exemplary methods may further take into account adjacent channel interference by estimating an adjacent channel interference level of the received signal and adjusting the signal level of the received signal to vary headroom for the signal of the analog to digital converter responsive to the interference level. This may be performed by adjusting the signal level based on interference when the interference level exceeds a threshold and adjusting the signal level based on the signal bandwidth and/or the channel delay spread when the interference level is below the threshold.

Some exemplary embodiments of the invention comprise a wireless communication receiver including a circuit configured to control a signal level of a received signal. One exemplary wireless communication receiver may comprise a bandwidth determination circuit configured to determine bandwidth of the received signal; a delay spread estimator configured to estimate the delay spread of a wireless channel; and an gain control circuit configured to adjust the signal level of the received signal based on at least one of the bandwidth of the received signal and delay spread of the wireless channel.

DETAILED DESCRIPTION

Figure 1:
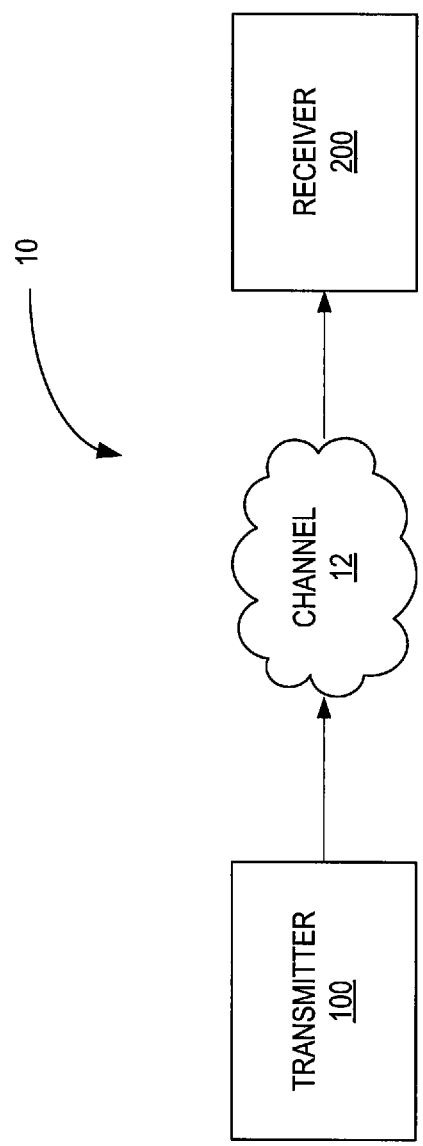
FIG. 1 illustrates an exemplary communication system.

Referring now to the drawings, FIG. 1 illustrates in simplified form a communication system indicated generally by the numeral 10. Communication network 10 may, for example, comprise a wireless communication system such as Wireless LAN or mobile communication network operating according to any standard now known or later developed, such as the Wideband Code Division Multiple Access (WCDMA) standard and the Long Term Evolution (LTE) standard. The communication network 10 includes a transmitter 100 and a receiver 200. Transmitter 100 transmits information over a communication channel 12 to receiver 200. Those skilled in the art will appreciate that transmitter 100 and receiver 200 may be part of a communication device having both a transmitter 100 and a receiver 200. The transmitter 100 may be included in a base station 100 in a mobile communication network, and the receiver 200 may be included in a user equipment in a wireless communication network, or vice versa. The present invention will be explained below in the context of an LTE communication network. Those skilled in the art will appreciate, however, that the present invention may be applied in networks operating according to other standards.

In an LTE network, the bandwidth allocated to receiver 200 may vary between 1.4 MHz and 20 MHz, depending on the amount of data to be transmitted. Further, the properties of the channel 12 over which the data is transmitted may vary significantly. In some cases, the channel 12 may be characterized by a single dominant path between the transmitter 100 and the receiver 200. In this case, the delay spread will be relatively small, usually in the order of 0.1 through 0.2 microseconds. In other cases, the channel 12 between the transmitter 100 and receiver 200 may comprise a multipath channel. In general, a multipath channel exists in situations where the received signal reflects off objects in the environment and arrives at the receiver 200 from different directions. In this case, the delay spread may be large, usually on the order of 2-3 microseconds. When data is transmitted from two or more antennas at different locations (such as for example, in broadcasting when the same signal is transmitted from two or more transmitter locations), the delay spread may be as large as 10 microseconds.

Figure 2:
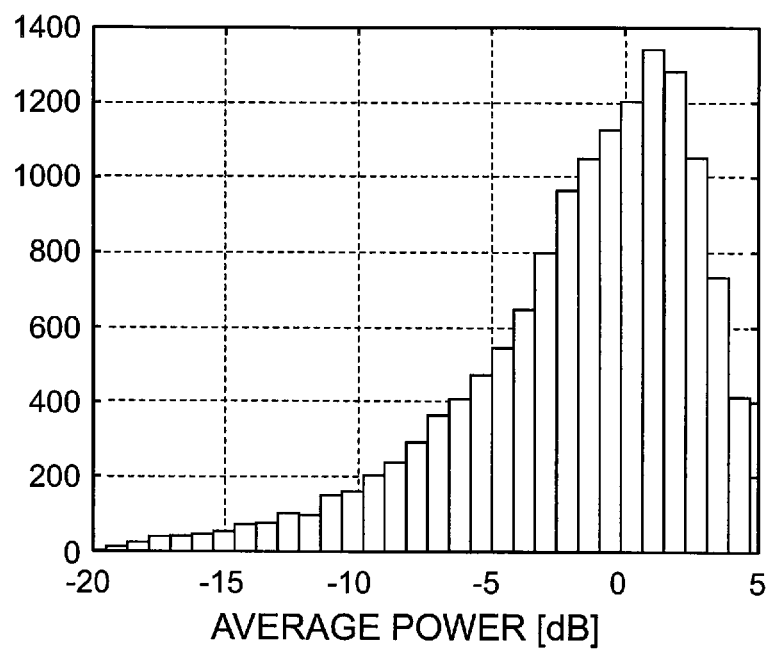
FIG. 2 is a histograph illustrating signal variation for a bandwidth of 1.4 MHz and a channel delay spread of 0.1 microseconds.
Figure 3:
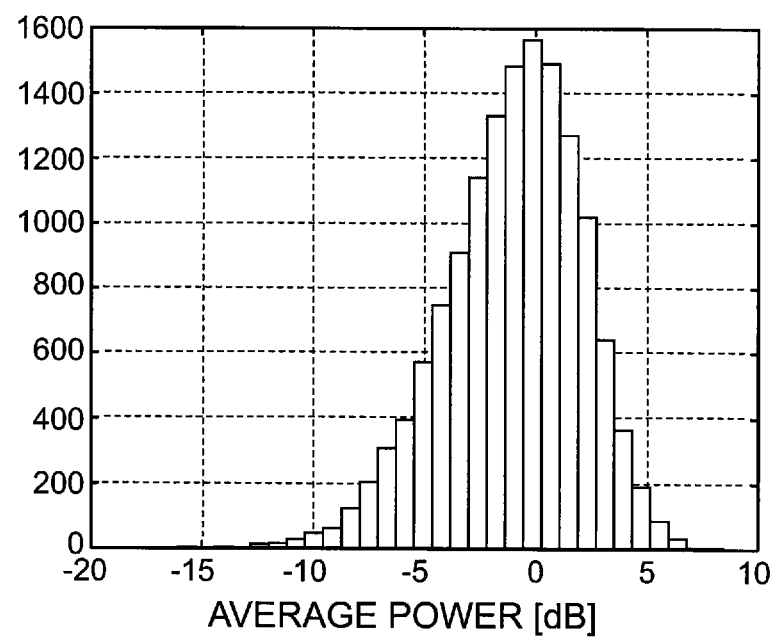
FIG. 3 is a histograph illustrating signal variation for a bandwidth of 1.4 MHz and a channel delay spread of 1.0 microseconds.
Figure 4:
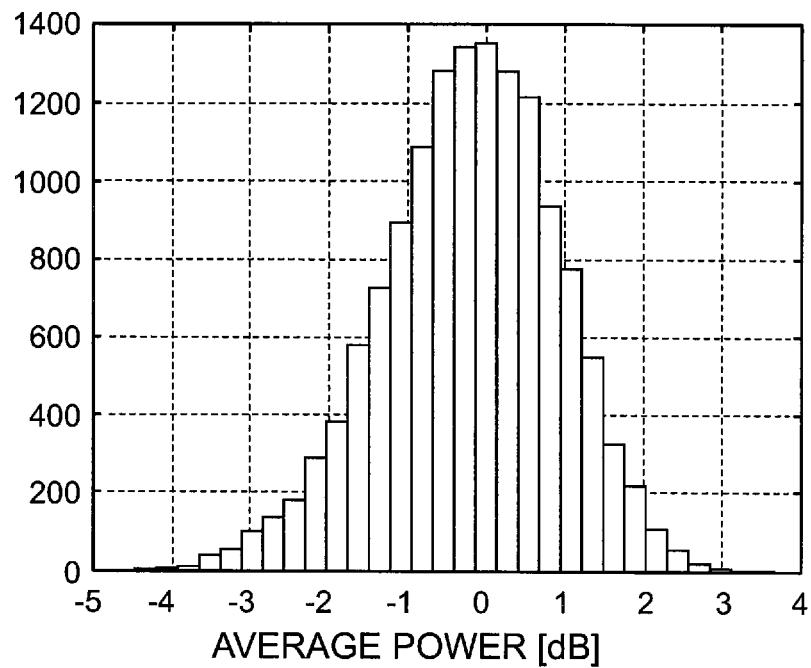
FIG. 4 is a histograph illustrating signal variation for a bandwidth of 1.4 MHz and a channel delay spread of 10.0 microseconds.
Figure 5:
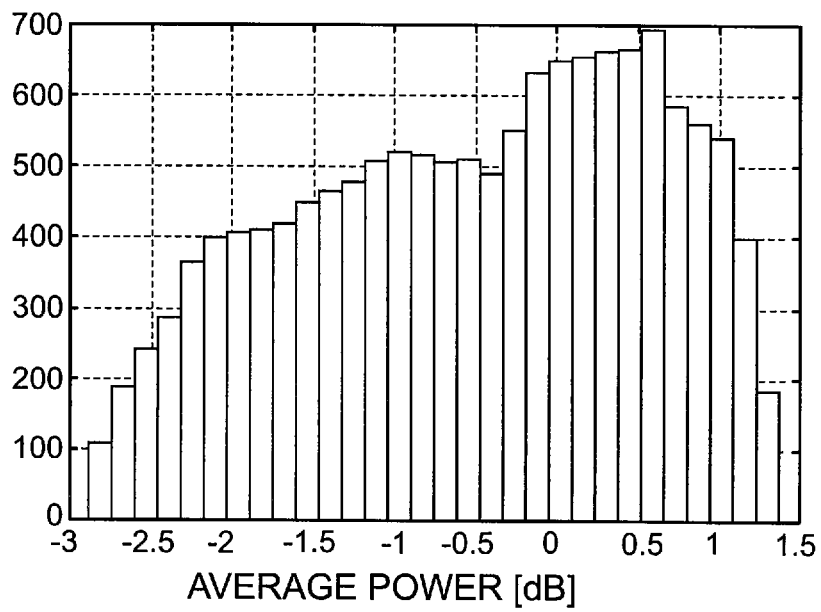
FIG. 5 is a histograph illustrating signal variation for a bandwidth of 18 MHz and a channel delay spread of 0.1 microseconds.
Figure 6:
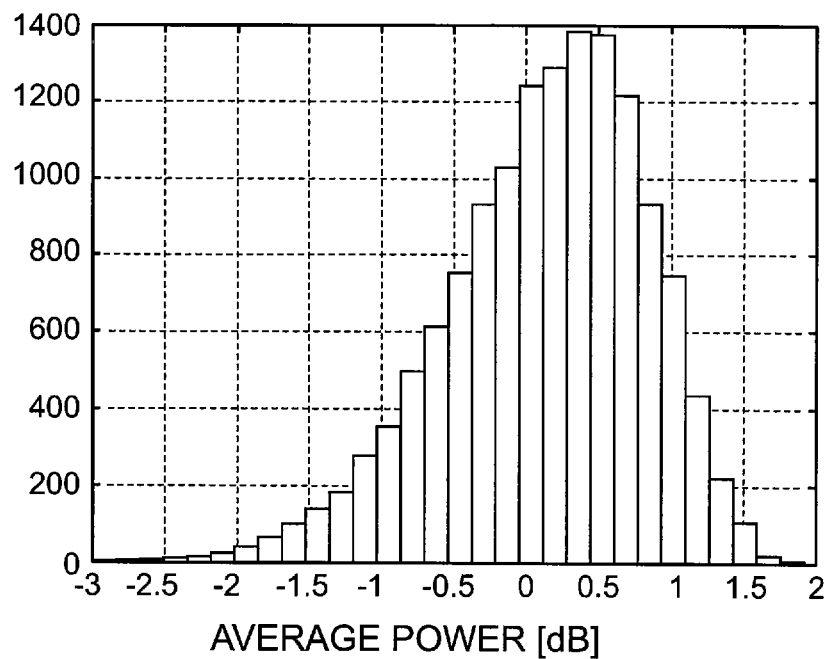
FIG. 6 is a histograph illustrating signal variation for a bandwidth of 18 MHz and a channel delay spread of 1.0 microseconds.
Figure 7:
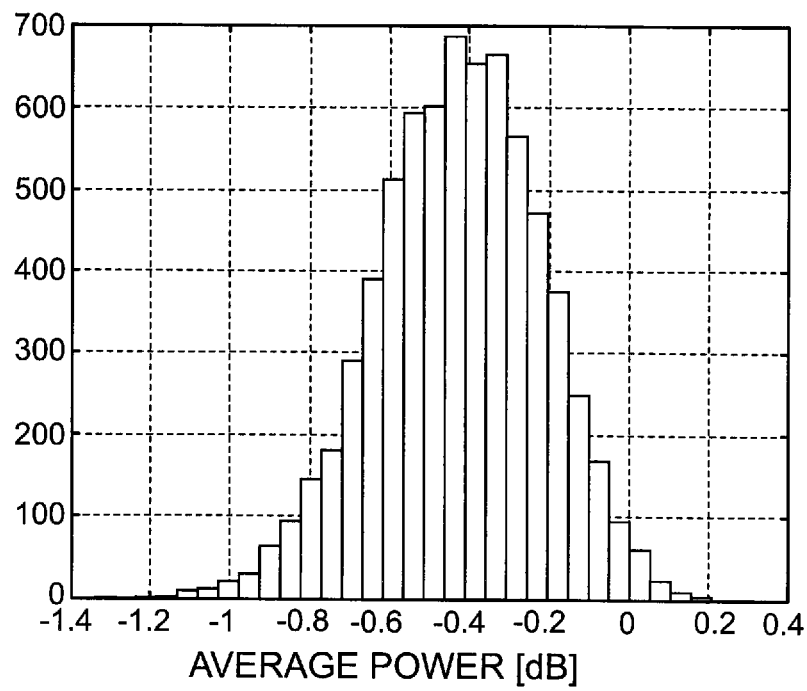
FIG. 7 is a histograph illustrating signal variation for a bandwidth of 18 MHz and a channel delay spread of 10.0 microseconds.

It has been observed that the magnitude of fast fading (the amount of variation in the received signal) may be accurately estimated based on knowledge of the bandwidth of the received signal and delay spread of the channel. FIGS. 2-4 illustrate the average received signal power as seen by the receiver 200 when the bandwidth is 1.4 MHz and the delay spread is varied. As seen in FIGS. 2-4, the average received signal power varies by approximately 20 dB with a delay spread of 0.1 microseconds (FIG. 2), by approximately 15 dB with a delay spread of 1 microsecond (FIG. 3), and by approximately 6 dB with a delay spread of 10 microseconds (FIG. 4). FIGS. 5-7 illustrate the average received signal power when the bandwidth is 18 MHz and the delay spread is varied. For a bandwidth of 18 MHz, the received signal power varies by approximately 4 dB with a delay spread of 0.1 microseconds (FIG. 5), by approximately 2.5 dB with a delay spread of 1 microsecond (FIG. 6), and by approximately 1 dB with a delay spread of 10 microseconds (FIG. 7). These graphs show an inverse relationship between signal power variation and both bandwidth and delay spread. That is, variations in the received signal power decrease as the signal bandwidth is increased or the channel delay spread is increased. The channel model used to obtain the simulation results shown in FIGS. 2-7 is a Rayleigh fading channel with an exponentially decaying impulse response.

Knowledge of the bandwidth and delay spread may be used to estimate an expected variation in the received signal power due to fast fading. The bandwidth of the received signal is known to receiver 200. However, the delay spread of the channel needs to be estimated. Techniques for estimating the delay spread of a wireless channel are well known in the art and the delay spread is frequently used in channel estimation. Therefore, estimates of the delay spread will likely be available in advanced receivers operating according to the LTE standard.

According to embodiments of the present invention, the receiver 200 can estimate the amount of variation in the received signal power due to fast fading based on the bandwidth of the received signal and delay spread of the channel, and use this estimate for automatic gain control to control the signal level in a receiver chain. More particularly, a gain control circuit, such as an AGC, including or associated with a variable gain amplifier, can be used to vary the signal level of the received signal based on the signal bandwidth and channel delay spread to vary the headroom of a signal in an analog-to-digital converter or other component in the receiver chain to provide margin for expected signal variation. Alternatively or in addition, the signal level can be varied in order to ensure that analog components are used at a suitable operating point. Amplifiers are example of such analog components, where a too large signal will result in saturation and by that degraded performance. On the other hand, if the signal level is too small, the power efficiency is typically smaller and the performance will be degraded since the SNR of the signal will be worse assuming a constant noise floor.

Figure 8:
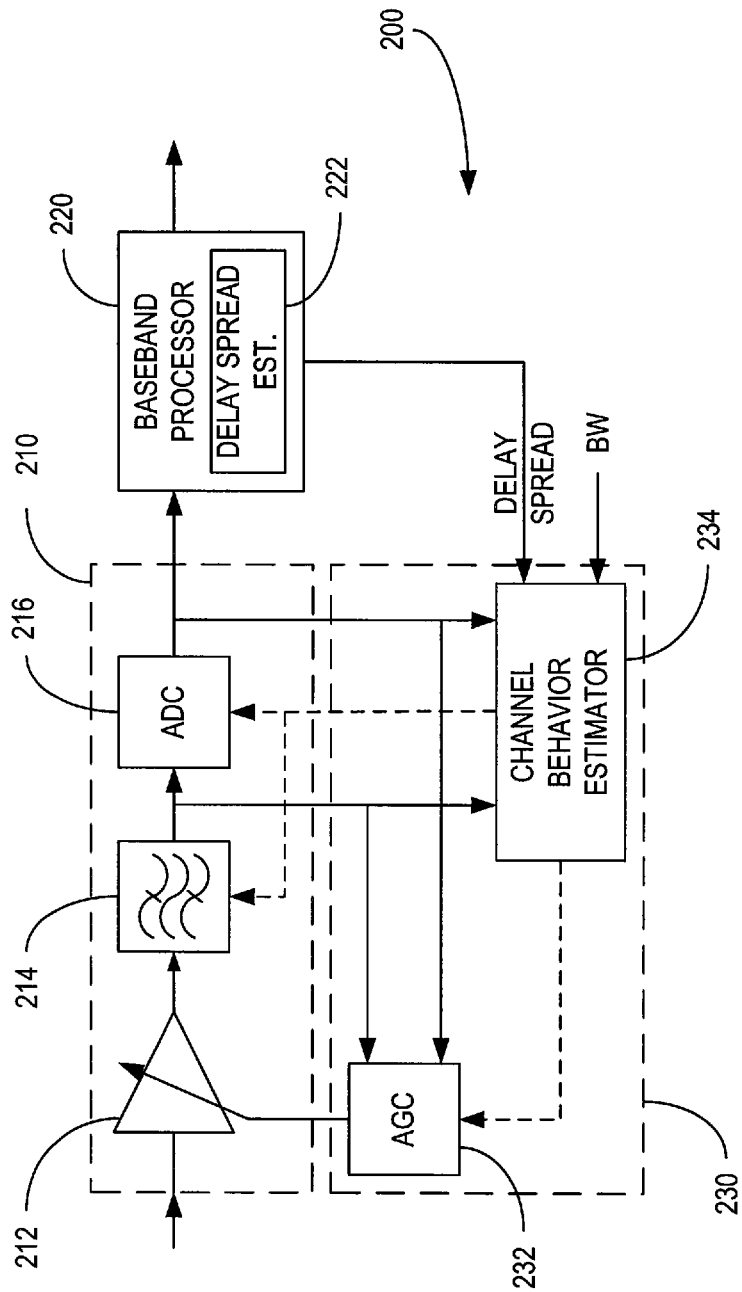
FIG. 8 illustrates an exemplary receiver according to one embodiment of the invention for adjusting the signal level of a received signal as a function of bandwidth and delay spread.

FIG. 8 illustrates an exemplary receiver 200 according to one embodiment of the invention. Receiver 200 comprises a receiver front end 210, processor 220, and a control unit 230. The receiver front end 210 includes a variable gain amplifier (VGA) 212, filter 214, and analog to digital converter 216. Variable gain amplifier 212 adjusts the signal level of the received signal responsive to control signals from the control unit 230. Alternatively, the variable gain amplification may be implemented by several amplifiers distributed at various places throughout the receiver chain. Adjustments to the signal level are made to avoid clipping in subsequent receiver chain components while at the same time ensuring that the full dynamic range of the receiver components is utilized. Filter 214, which may comprise a low pass filter, reduces the level of adjacent interference before the ADC thereby allowing a larger part of the dynamic range of the ADC to be used by the desired signal. Analog to digital converter 216 samples and converts the received signal into a digital signal for input to the processor 220.

Processor 220 comprises one or more processors to perform functions, such as channel estimation, demodulation, and decoding, and outputs information received from the transmitter 100. The processor 220 in the exemplary embodiment includes a delay spread estimator 222 to estimate the delay spread of the channel, which may be used for channel estimation. As described in more detail below, the delay spread is also used for gain control.

Control unit 230 controls VGA 212 so that the signal level output by the VGA 212 will not cause clipping. The control unit 230 comprises a gain control circuit 232 and a channel behavior estimator 234. The gain control circuit 232 may comprise a conventional automatic gain control circuit, which is well known in the art. The gain control circuit 232 determines the signal strength of the received signal and adjusts the gain of the variable gain amplifier 212 responsive to the estimated signal strength. The signal strength can be estimated at one or more locations. In the illustrated environment, the gain control circuit 232 estimates the signal strength at the outputs of the filter 214 and analog to digital converter 216. The channel behavior estimator 234 controls the operation of the gain control circuit 232 based on the bandwidth of the received signal and delay spread of the channel. The processor 220 may include a delay spread estimator 222 for estimating the delay spread of the wireless channel and a bandwidth determination unit 224 to determine the bandwidth of the received signal. The delay spread is frequently used in LTE systems for channel estimation purposes. In the present invention, the estimated delay spread is supplied to the channel behavior estimator 234 along with the bandwidth of the received signal, which is typically known to the receiver 200 in LTE systems.

The delay spread can for example be estimated from a power delay profile, which may be obtained by correlating differently delayed versions of a received signal with a known signal that is expected to find correlation peaks. One example of a known signal is a signal obtained from the primary synchronization channel in LTE systems. Since techniques for estimating delay spread are well known in the art, further discussion of these techniques is omitted.

As shown in FIGS. 2-7, the expected signal variation due to fast-fading can be estimated from the delay spread of the channel and bandwidth of the received signal. The channel behavior estimator 234 receives the delay spread of the channel and bandwidth of the received signal, and makes adjustments to the gain control circuit 232 to vary the margins of the signal in the analog to digital converter 216 or other receiver component. The margin or headroom of the signal of the analog to digital converter 216 or other receiver component is adjusted to prevent clipping while at the same time ensuring that the effective number of bits (ENOB) of the analog to digital converter 216 is as large as possible. The channel behavior estimator 234 may, for example, control parameters of the gain control circuit 232, such as the speed, gain steps, range, etc. In some embodiments of the invention, the channel behavior estimator 234 may also vary the ENOB or dynamic range (DR) of the analog to digital converter 216 or other receiver chain components. Amplifiers are example of such analog components, where a too large signal will result in saturation and by that degraded performance. On the other hand, if the signal level is too small, the power efficiency is typically smaller and the performance will be degraded since the SNR of the signal will be worse assuming a constant noise floor.

Figure 9:
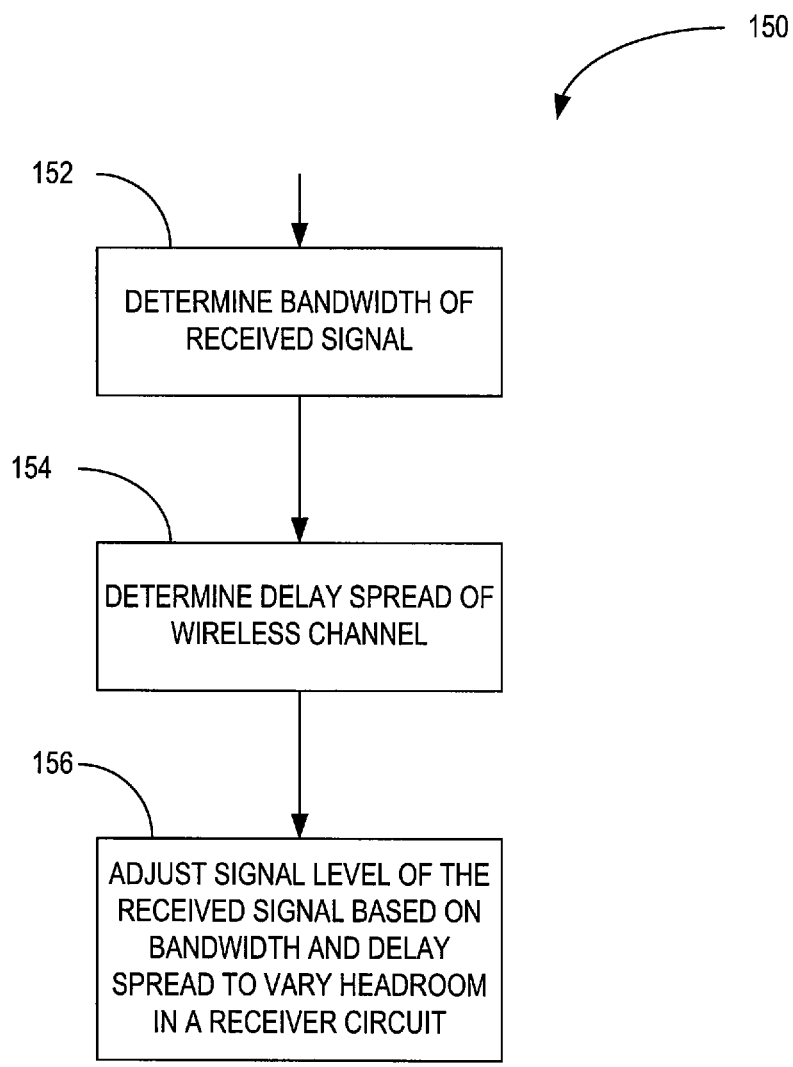
FIG. 9 illustrates an exemplary method implemented by the receiver for adjusting the signal level of a received signal as a function of bandwidth and delay spread.

FIG. 9 illustrates an exemplary method 150 implemented by the receiver 200 according to embodiments of the present invention. Receiver 200 determines the bandwidth of the received signal and/or delay spread of the channel (blocks 152 and 154). The bandwidth of the received signal is typically known to the receiver 200 when resource allocations are made to the receiver 200. The delay spread can for example be estimated from a power delay profile by the delay spread estimator 222 as previously described. Based on the bandwidth of the received signal and/or delay spread of the channel, the variable gain amplifier 212 is controlled to adjust the signal level of the received signal (block 156). As noted above, adjustments to the signal level are made to vary the headroom of the signal in a receiver component, such as an analog to digital converter 216, in order to avoid clipping. In general, the signal level is lowered to increase headroom of the signal for the analog to digital converter 216 responsive to decreasing signal bandwidth and decreasing channel delay spread. Conversely, the signal level is increased to reduce headroom of the signal for the analog to digital converter 216 responsive to increasing signal bandwidth and increasing channel delay spread. Ideally the signal level output by the variable gain amplifier 212 should be as high as possible while avoiding clipping in order to more efficiently use the full dynamic range of the receiver components. This implies that the headroom should be as low as possible.

In some embodiments of the invention, the amount of headroom provided in the signal of the analog to digital converter 216 or other receiver component is further based on the amount of interference from adjacent channels. When the adjacent channel interference is strong, adjustments in the headroom may be based on the level of interference. Conversely, when the adjacent channel interference is low, adjustments to the headroom may be based on bandwidth and delay spread as previously described. Interference estimation may be performed by the processor 220 and interference estimates may be provided to the channel behavior estimator 234. Techniques for estimating interference from adjacent channels are well known in the art and are not described herein.

Figure 10:
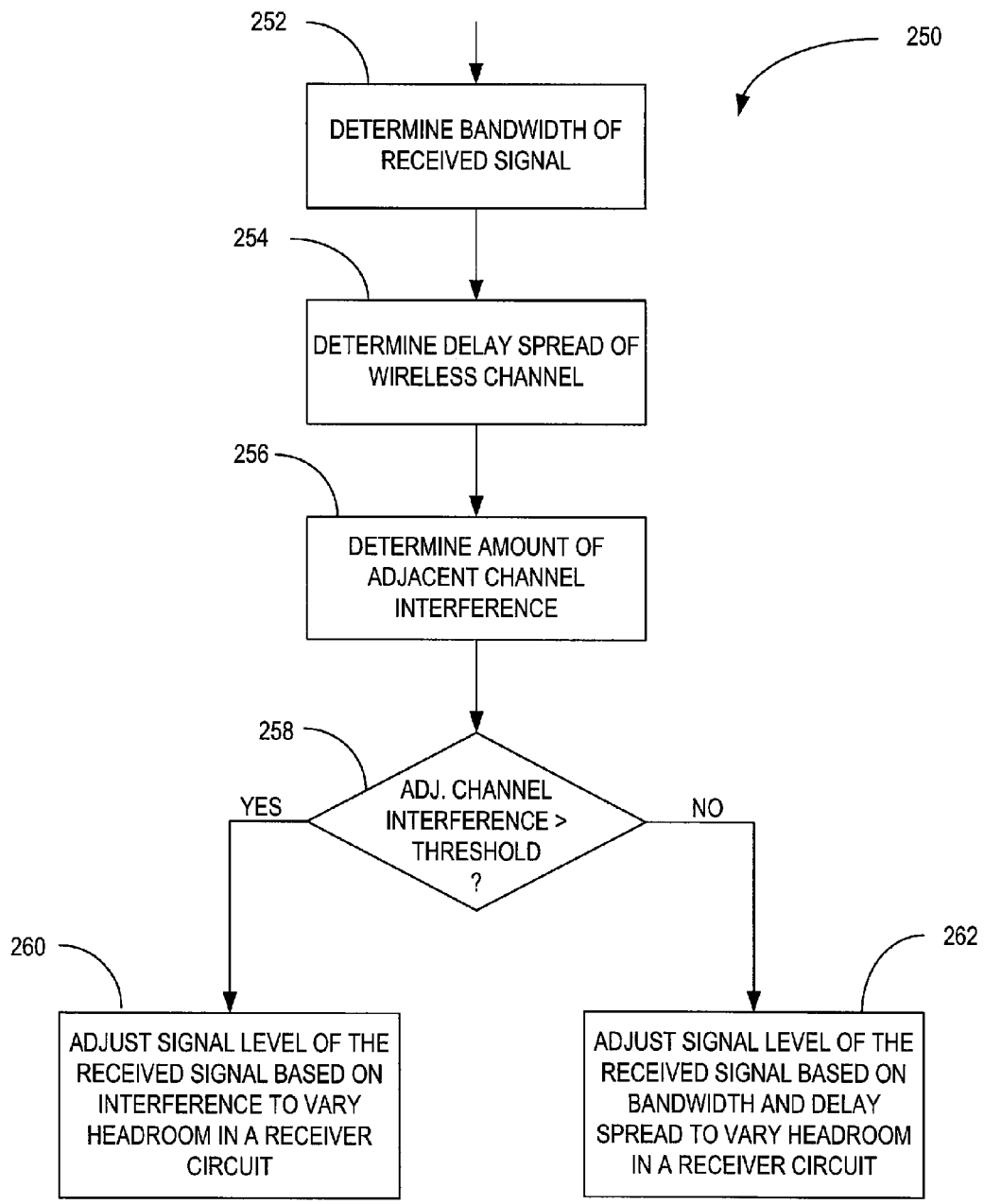
FIG. 10 illustrates an exemplary method implemented by the receiver for adjusting the signal level of a received signal as a function of adjacent channel interference, bandwidth, and delay spread.

FIG. 10 illustrates an exemplary gain control method 250 implemented by the receiver 200 that takes into account the amount of interference from adjacent channels. In this embodiment, receiver 200 determines the bandwidth of the received signal and delay spread of the channel as previously described (blocks 252 and 254). The receiver 200 also estimates the amount of interference from adjacent channels (block 256). Estimation of the adjacent channel interference may be performed by the processor 220. The interference estimate, delay spread estimate, and bandwidth are input to control unit 230. The control unit 230 compares the interference estimate with a predetermined threshold (block 258). If the interference estimate meets or exceeds the predetermined threshold, the control unit 230 makes adjustments to vary the headroom based on the adjacent channel interference (block 260). However, if the adjacent channel interference is below the threshold, control unit 230 adjusts the signal level of the received signal based on the bandwidth and/or delay spread as previously described to vary the headroom of the signal of the analog to digital converter 216 or other receiver component.

The delay spread and bandwidth of the received signal provide an accurate indication of the expected amount of signal variation. Knowledge of the delay spread and bandwidth allows the control unit 230 to vary the amount of headroom in the analog to digital converter 216 or other receiver component to avoid clipping while at the same time utilizing the full dynamic range or effective number of bits. While the present invention is used to vary the signal level at the input of an analog to digital converter 216, the techniques may be applied to other analog circuits which are typically rated by the dynamic range or spurious free dynamic range. Although various embodiments of the present invention have been described and shown, the invention is not restricted thereto, but may also be embodied in other ways within the scope of the subject-matter defined in the following claims and their legal equivalents.

The present invention may, of course, be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of controlling a signal level in a wireless communication circuit said method comprising:
    receiving a signal propagated through a wireless channel;
    determining at least one of the bandwidth of the received signal and the delay spread of the wireless channel; and
    adjusting a signal level of the received signal by a gain control circuit based on the bandwidth of the received signal and the delay spread of the wireless channel to provide sufficient headroom to prevent the received signal from being clipped.

2. The method of claim 1 wherein adjusting a signal level of the received signal by a gain control circuit based on at least one of the bandwidth of the received signal and delay spread of the wireless channel comprises decreasing the signal level to increase headroom for a signal in an analog to digital converter responsive to at least one of decreasing bandwidth and decreasing delay spread.

3. The method of claim 1 wherein adjusting a signal level of the received signal by a gain control circuit based on at least one of the bandwidth of the received signal and delay spread of the wireless channel comprises increasing the signal level to decrease headroom for a signal in an analog to digital converter responsive to at least one of increasing bandwidth and increasing delay spread.

4. The method of claim 1 wherein adjusting the signal level of the received signal by a gain control circuit comprises adjusting the gain of a variable gain amplifier preceding an analog to digital converter based on at least one of the bandwidth of the received signal and delay spread of the wireless channel.

5. The method of claim 1 further comprising:
    estimating an interference level of said received signal; and
    adjusting the signal level of the received signal to vary headroom for a signal of an analog to digital converter responsive to the interference level.

6. The method of claim 5 wherein adjusting the signal level of the received signal to vary headroom for the signal of the analog to digital converter responsive to the interference level comprises adjusting the signal level based on interference when the interference level exceeds a threshold.

7. The method of claim 5 further comprising adjusting the signal level based on at least one of the signal bandwidth and the channel delay spread when the interference level is below a threshold.

8. The method of claim 1 wherein the signal level is adjusted based on the bandwidth of the received signal.

9. The method of claim 1 wherein the signal level is adjusted based on the delay spread of the wireless channel.

10. A circuit for controlling a signal level of a received signal, said circuit comprising:
    a processor to determine at least one of a bandwidth of the received signal and delay spread of a wireless channel; and
    a gain control circuit configured to adjust the signal level of the received signal based on the bandwidth of the received signal and delay spread of the wireless channel to provide sufficient headroom to prevent the receive signal from being clipped.

11. The circuit of claim 10 further comprising an analog to digital converter configured to convert the received signal from analog to digital form; and wherein the gain control circuit is configured to decrease the signal level to increase headroom for the signal of the analog to digital converter responsive to at least one of decreasing signal bandwidth and decreasing channel delay spread.

12. The circuit of claim 10 further comprising an analog to digital converter configured to convert the received signal from analog to digital form; and wherein the gain control circuit is configured to increase the signal level to decrease headroom for the signal of the analog to digital converter responsive to increasing signal bandwidth and increasing channel delay spread.

13. The circuit of claim 10 wherein the gain control circuit is configured to adjust the gain of a variable gain amplifier preceding the analog to digital converter based on at least one of the bandwidth of the received signal and delay spread of the wireless channel.

14. The circuit of claim 10 further comprising an interference estimator configured to estimate interference in the received signal, the gain control circuit being further configured to adjust the signal level of the received signal responsive to the interference in the received signal.

15. The circuit of claim 14 wherein the gain control circuit is configured to adjust the signal level based on interference when the interference level exceeds a threshold.

16. The circuit of claim 14 wherein the gain control circuit is further configured to adjust the signal level based on at least one of the signal bandwidth and the channel delay spread when the interference level is below a threshold.

17. The circuit of claim 10 wherein the gain control circuit is configured to adjust the signal level of the received signal based on the bandwidth of the received signal.

18. The circuit of claim 10 wherein the gain control circuit is configured to adjust the signal level of the received signal based on the delay spread of the wireless channel.

19. A wireless communication receiver, comprising a circuit configured to control a signal level of a received signal, said circuit comprising:

a processor to determine at least one of a bandwidth of the received signal and delay spread of a wireless channel; and a gain control circuit configured to adjust the signal level of the received signal to vary the headroom of a signal for a receiver circuit based on the bandwidth of the received signal and delay spread of the wireless channel to provide sufficient headroom to prevent the received signal from being clipped.

20. A user equipment comprising the wireless communication receiver of claim 19.

* * * * *

UNITED STATES PATENT AND TRADEMARK OFFICE
CERTIFICATE OF CORRECTION

PATENT NO.        : 8,731,500 B2
APPLICATION NO.   : 12/361578
DATED             : May 20, 2014
INVENTOR(S)       : Wilhelmsson et al.

It is certified that error appears in the above-identified patent and that said Letters Patent is hereby corrected as shown below:

In the Specification

In Column 3, Line 57, delete "station 100" and insert -- station --, therefor.

Signed and Sealed this
Fourteenth Day of October, 2014

Michelle K. Lee
*Deputy Director of the United States Patent and Trademark Office*